US009354283B2

(12) United States Patent
Ocak et al.

(10) Patent No.: US 9,354,283 B2
(45) Date of Patent: May 31, 2016

(54) SENSOR AND METHOD OF CONTROLLING THE SAME

(71) Applicant: Agency for Science, Technology and Research, Singapore (SG)

(72) Inventors: Ilker Ender Ocak, Singapore (SG); Julius Ming Lin Tsai, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 57 days.

(21) Appl. No.: 14/071,766

(22) Filed: Nov. 5, 2013

(65) Prior Publication Data

US 2014/0125325 A1 May 8, 2014

(30) Foreign Application Priority Data

Nov. 5, 2012 (SG) ................. 201208160-0

(51) Int. Cl.
*G01R 33/02* (2006.01)
*G01R 33/028* (2006.01)

(52) U.S. Cl.
CPC .................... *G01R 33/0286* (2013.01)

(58) Field of Classification Search
CPC ........................................................ G01R 33/02
USPC ..................................................... 324/207.13
See application file for complete search history.

(56) References Cited

U.S. PATENT DOCUMENTS

| | | | |
|---|---|---|---|
| 4,448,605 A * | 5/1984 | Mizuhara ................... | 420/125 |
| 6,215,318 B1 * | 4/2001 | Schoefthaler et al. ....... | 324/658 |
| 6,664,786 B2 * | 12/2003 | Kretschmann et al. ...... | 324/259 |
| 2004/0158439 A1 | 8/2004 | Kim et al. | |
| 2005/0248340 A1 | 11/2005 | Berkcan et al. | |
| 2007/0096729 A1 * | 5/2007 | Brunson et al. ............... | 324/244 |
| 2013/0218009 A1 * | 8/2013 | Balakin ................ | A61N 5/1077 600/427 |

FOREIGN PATENT DOCUMENTS

| | | |
|---|---|---|
| DE | 19827056 A1 | 12/1999 |
| EP | 0646805 A1 | 4/1995 |
| EP | 1004882 A2 | 5/2000 |
| WO | 02077613 A2 | 10/2002 |
| WO | 2005062064 A1 | 7/2005 |

OTHER PUBLICATIONS

Lenz et al., "Magnetic Sensors and Their Applications," IEEE Sensors Journal, vol. 6, No. 3, Jun. 2006, pp. 631-649.
Marina Diaz-Michelena, "Small Magnetic Sensors for Space Applications", Sensors, 2009, vol. 9, pp. 2271-2288.

(Continued)

*Primary Examiner* — Tung X Nguyen
*Assistant Examiner* — Zannatul Ferdous
(74) *Attorney, Agent, or Firm* — Winstead, P.C.

(57) ABSTRACT

According to embodiments of the present invention, a sensor is provided. The sensor includes a substrate, a beam suspended from the substrate, and a plurality of conductive lines arranged on the beam, wherein the beam is adapted to be displaced in response to a current flowing through the plurality of conductive lines, and a magnetic field interacting with the beam, and wherein the sensor is configured to determine a property of the magnetic field based on the displacement of the beam. According to further embodiments of the present invention, a method of controlling a sensor is also provided.

18 Claims, 7 Drawing Sheets

(56) References Cited

OTHER PUBLICATIONS

Behraad Bahreyni, "Design, Modeling, Simulation, and Testing of Resonant Micromachined Magnetic Field Sensors", Ph. D. Thesis, University of Manitoba, Winnipeg, Canada, 2006, pp. 1-208, see pp. 1-25, 67-72 and 156.

Mandhi et al., "Some New Horizons in Magnetic Sensing: High-Tc SQUIDs, GMR and GMI Materials", Sensors and Actuators A, vol. 105, 2003, pp. 271-285.

D. J. Mapps, "Remote Magnetic Sensing of People", Sensors and Actuators A, vol. 106, 2003, pp. 321-325.

Kadar et al., "Magnetic-Field Measurements Using an Integrated Resonant Magnetic-Field Sensor," Sensors and Actuators A, vol. 70, 1998, pp. 225-232.

Emmerich et al., "Magnetic Field Measurements with a Novel Surface Micromachined Magnetic-Field Sensor", IEEE Transactions on Electron Devices, vol. 47, No. 5, May 2000, pp. 972-977.

Bahreyni et al., "A Resonant Micromachined Magnetic Field Sensor", IEEE Sensors Journal, vol. 7, No. 9, Sep. 2007, pp. 1326-1334.

Search Report for Singapore Patent Application No. 2013081724 dated Dec. 2, 2014, pp. 1-9.

Written Opinion for Singapore Patent Application No. 2013081724 dated Dec. 2, 2014, pp. 1-14.

* cited by examiner

SENSOR AND METHOD OF CONTROLLING THE SAME

CROSS-REFERENCE TO RELATED APPLICATION

This application claims the benefit of priority of Singapore patent application No. 201208160-0, filed 5 Nov. 2012, the content of it being hereby incorporated by reference in its entirety for all purposes.

TECHNICAL FIELD

Various embodiments relate to a sensor and a method of controlling the sensor.

BACKGROUND

Inertial navigation sensors play a very important role in today's technology. Three axis gyroscopes and accelerometers are widely used for tracking the movement or velocity of any subject, such as an object, vehicle or person. On top of these sensors (e.g. one or more 3-axis gyroscopes and one or more 3-axis accelerometers), initial position of the subject is also acquired from the Global Positioning System (GPS) to find and track the subject around the Earth. However, the initial orientation of the sensor is required for tracking the position of the subject and this information can be obtained by a three axis magnetometer sensor. By measuring the strength and direction of the Earth's magnetic field, a magnetometer system can detect its orientation with respect to the Earth. Therefore, magnetometers are indispensable elements for tracking systems.

In addition to sensing orientation with respect to the Earth, magnetometers have wide range of usage. These application areas can be listed as automotive sensors, non-destructive material testing, security systems, structural stability, medical sensors, and military instruments, for example. To meet the requirements of all these different applications, there are many different magnetic field sensors available. Some of the magnetic field sensors can be listed as Superconducting Quantum Interference Device (SQUID), Hall Effect Magnetometers, search coils, Fluxgate Magnetometers, Anisotropic Magnetoresistive (AMR), Giant Magnetoresistive (GMR), Fiber Optic sensors and MEMS (Micro-Electro-Mechanical-System) Magnetometers.

Figure 1A:
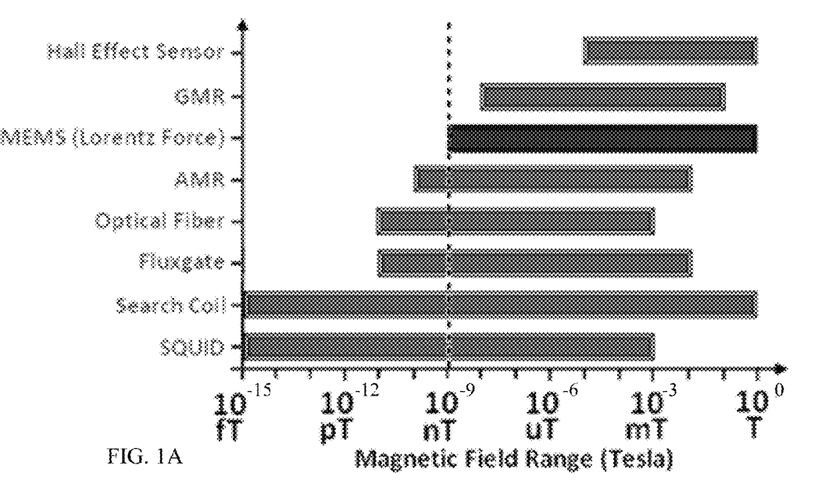
FIG. 1A shows the comparison of the resolution and maximum range of different magnetic field measuring technologies.
Figure 1B:
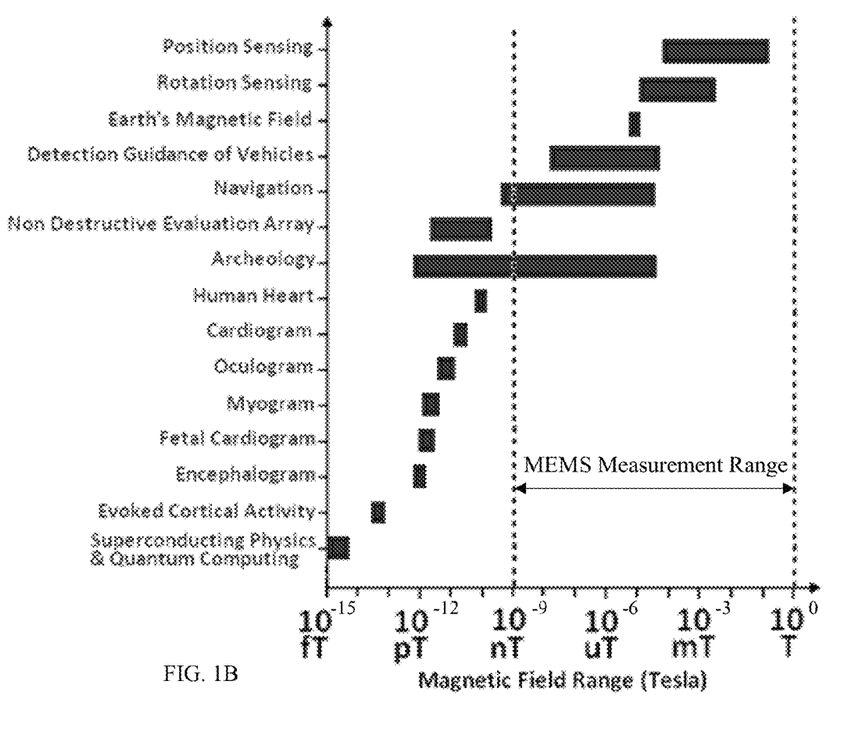
FIG. 1B shows the measurement range requirement for magnetometers for different application areas.

FIG. 1A compares the resolution and maximum range of different magnetic field measuring technologies. Based on FIG. 1A, search coil and SQUID sensors have the largest measurement range to resolution ratio. However, search coils can only measure varying magnetic fields which is not suitable for measuring the Earth's magnetic field, while SQUID sensors need special operation environment (e.g. liquid Helium supply, electromagnetic shielding) and have a power consumption of several watts. MEMS magnetometers also have a large measurement range to resolution ratio, but their real advantage is having a small size and low power consumption. They do not need any specific magnetic material to operate and they are suitable for many application areas. FIG. 1B shows the measurement range requirement for magnetometers for different application areas.

There are different MEMS capacitive magnetometers available, including a lateral axis magnetometer with a see-saw structure, and vertical axis magnetometers with capacitive comb finger sensing. Capacitive MEMS magnetometers basically carry a sinusoidal current orthogonal to their sensitive axis. An externally applied magnetic field generates a force proportional to both the magnitude of the current and the length of the current carrying beam and the direction of the force is in the direction of the cross product of the current and magnetic field, which is the sensitive axis of the magnetometer.

Generally, a current is applied to a magnetometer so that with an external magnetic field, a Lorentz force is generated on the magnetometer. In conventional magnetometers, these structures drive the current through the suspended structure to generate the Lorentz Force when there is an applied magnetic field. The current is very inefficiently used as the current passes through the structure just once. Further, the suspended structure itself is a high resistivity current path.

SUMMARY

According to an embodiment, a sensor is provided. The sensor may include a substrate, a beam suspended from the substrate, and a plurality of conductive lines arranged on the beam, wherein the beam is adapted to be displaced in response to a current flowing through the plurality of conductive lines, and a magnetic field interacting with the beam, and wherein the sensor is configured to determine a property of the magnetic field based on the displacement of the beam.

According to an embodiment, a method of controlling a sensor is provided. The method may include positioning a sensor in a magnetic field, applying a current to a plurality of conductive lines arranged on a beam of the sensor, the beam being suspended from a substrate of the sensor, wherein the beam is displaced in response to the current flowing through the plurality of conductive lines, and the magnetic field interacting with the beam, and determining a property of the magnetic field based on the displacement of the beam.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may relate to a capacitive magnetometer and/or a resonating magnetometer.

Various embodiments may provide a current driving structure for a vertical axis Lorentz force MEMS magnetometer.

Various embodiments may provide a magnetometer (e.g. capacitive magnetometer) with a current reuse architecture. The magnetometer may be a MEMS vertical axis magnetometer, for example a MEMS vertical axis capacitive magnetometer with a current reuse architecture. In various embodiments, a current may be applied to the magnetometer so that with an external magnetic field, a Lorentz force may be generated on the magnetometer. This applied current may be used more effectively and with less power loss in the structure of the magnetometer of various embodiments. For example, the applied current may pass through one or more conductive (e.g. metal) lines, acting as current paths, provided on the magnetometer. Further, the applied current may pass through the structure of the magnetometer more than once, meaning that the current may be reused.

In various embodiments, a current reuse architecture may be employed for a vertical axis magnetometer sensor of various embodiments. A vertical axis capacitive magnetometer detects a magnetic field using the Lorentz force principle. An external magnetic field may generate a force orthogonal to the current flow direction on the suspended magnetometer mass and the magnitude of this force may be proportional to both the amplitude of the sinusoidal current applied to the magnetometer and the length of the conductive beam of the magnetometer carrying this current. In various embodiments, a method or approach may be provided in the magnetometer to reuse this current several times to multiply the sensitivity of a MEMS magnetometer.

Various embodiments may provide a current reuse architecture for a vertical axis magnetometer or sensor which may include serially connected parallel conductive lines (e.g. metal lines) deposited on a suspended mass or beam of the magnetometer. The conductive lines (e.g. metal lines) may conduct an applied current (e.g. an applied AC current) in the same direction, and accordingly, the resulting Lorentz force due to any applied magnetic field may be a summation of forces. In various embodiments, multiple layers may be used to create or form the parallel conductive lines (e.g. metal lines) which may further improve the sensitivity of the sensor.

In various embodiments, instead of directly applying the current to the magnetometer body, an insulating layer may first be deposited over the magnetometer body, for example over an active area or mass of the magnetometer, which may act as a sensing portion to detect the external magnetic field. A conductive line (e.g. metal line) may be fabricated on top of the mass, over the insulating layer, or a plurality of conductive lines (e.g. metal lines) which are serially connected to each other may be fabricated on top of the mass, over the insulating layer, by winding the conductive lines (e.g. metal lines) around the structure or body of the magnetometer. At the mass portion, the conductive lines (e.g. metal lines) may be arranged spaced apart from each other. At the mass portion, the conductive lines (e.g. metal lines) may be arranged at least substantially parallel to each other. It should be appreciated that the conductive lines (e.g. metal lines) may be part of a single continuous line arranged to wind around the structure of the magnetometer so that a plurality of conductive line (e.g. metal line) portions are arranged over the mass to define conductive lines (e.g. conductive metal lines). By using the conductive line(s) (e.g. metal line(s)) as current path(s), sensitivity and noise performance of the system or magnetometer may be improved while the power dissipation may be decreased.

In various embodiments, the structure employed may increase the sensitivity of the MEMS Lorentz Force magnetometer while decreasing its noise floor. With this structural improvement, the magnetometer may be driven with the same amount of current as for conventional devices, but with a lower power consumption.

Various embodiments may provide a sensor (e.g. a magnetometer) that may be cost-effective, with easy implementation. The sensor may have enhanced sensitivity and resolution.

Various embodiments may also provide a method of forming a sensor (e.g. a magnetometer). A suspended structure or beam may be formed over a substrate. A layer of insulating material may be deposited on top of the suspended structure. Metal lines that may conduct an alternating current (AC) may be deposited on top of the insulating material. Multiple parallel metal lines may be deposited, where the metal lines may be connected in series by creating windings around the magnetometer structure.

Figure 2A:
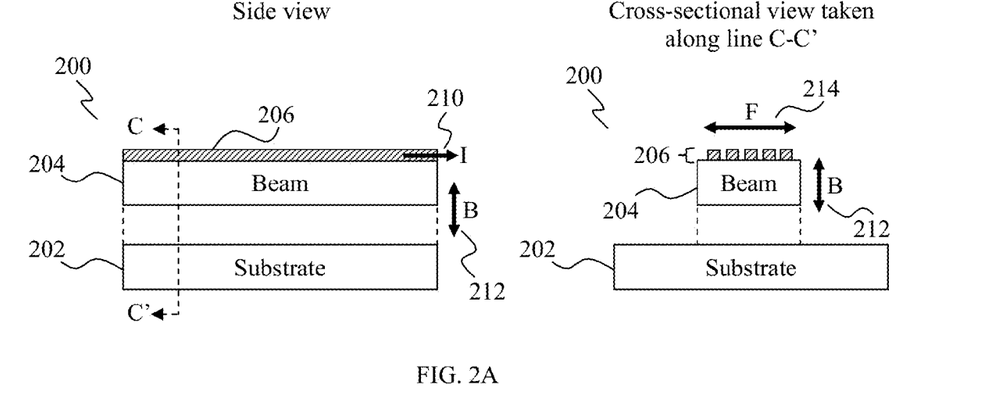
FIG. 2A shows schematic cross-sectional views of a sensor, according to various embodiments.

FIG. 2A shows schematic cross-sectional views of a sensor 200, according to various embodiments. The sensor 200 includes a substrate 202, a beam 204 suspended from the substrate 202, and a plurality of conductive lines 206 arranged on the beam 204, wherein the beam 204 is adapted to be displaced in response to a current flowing through the plurality of conductive lines 206, and a magnetic field interacting with the beam 204, and wherein the sensor 200 is configured to determine a property of the magnetic field based on the displacement of the beam 204.

In other words, a sensor (e.g. a magnetic field sensor or a magnetometer) 200 may be provided. The sensor 200 may include a substrate 202 and a beam 204. At least a portion of the beam 204 may be spaced apart from the substrate 202 so as to enable the beam 204 to be suspended from the substrate 202. The beam 204 may be electrically isolated from the substrate 202. A plurality of conductive lines 206 may be formed or fabricated over the beam 204, for example on top of the beam 204. In operation, the sensor 200 may be positioned in a magnetic field, B, for example the sensor 200 may be placed in a vicinity of an external magnetic field for determining a property of the external magnetic field. The magnetic field may interact with or act on the beam 204. A current, I, may be applied to the plurality of conductive lines 206, to flow through the plurality of conductive lines 206. A combination of the flow of the current through the plurality of conductive lines 206, and the interaction of the magnetic field with the beam 204 may cause displacement of the beam 204, and the sensor 200 may determine a property of the magnetic field based on this beam displacement.

The beam 204 may be an elongate structure, and having a longitudinal axis. In the context of various embodiments, the beam 204 may have a length of about 100 µm's to few mm's (e.g. 4-5 mm), for example between about 100 µm and about 5 mm, between about 100 µm and about 4 mm, between about 100 µm and about 1.6 mm, between about 500 µm and about 5 mm, between about 1000 µm (1 mm) and about 5 mm, between about 1 mm and about 4 mm, between about 1 mm and about 2 mm, or between about 1 mm and about 1.6 mm, e.g. about 1.6 mm.

In various embodiments, the beam 204 may be displaced from an equilibrium position. The beam 204 may be displaced from the equilibrium position bi-directionally.

In various embodiments, the beam 204 may be displaced laterally, e.g. in a sideward motion. The direction of the displacement may be at least substantially transverse to the longitudinal axis of the beam 204.

In various embodiments, the beam 204 may be integrated with the substrate 202. In various embodiments, the beam 204 may be a part of the substrate 202. For example, a portion of the substrate 202 may be formed to be suspended from a base portion of the substrate 202, such that the suspended portion defines the beam 204.

In various embodiments, the plurality of conductive lines 206 may be electrically isolated from each other. As a non-limiting example, the plurality of the conductive lines 206 may be arranged in contact with a non-conductive plane or surface to electrically isolate the plurality of conductive lines 206 from each other.

In various embodiments, the plurality of conductive lines 206 may be spaced apart from each other. The plurality of conductive lines 206 may be arranged along a length of the beam 204, e.g. at least substantially parallel to the length or longitudinal axis of the beam 204. Therefore, the current flowing through the plurality of conductive lines 206 may flow in a direction along the length of the beam 204. In various embodiments, the plurality of conductive lines 206 may be arranged along the entire length of the beam 204.

In various embodiments, the plurality of conductive lines 206 may be connected to each other. The plurality of conductive lines 206 may be electrically coupled to each other.

In the context of various embodiments, each conductive line 206 may provide a current carrying path. For example, each conductive line 206 may be a low resistivity current path. By using the plurality of conductive lines as current paths, the sensitivity and noise performance of the sensor 200 may be improved, and the power dissipation of the sensor 200 may be decreased.

In the context of various embodiments, the plurality of conductive lines 206 may be separate individual conductive lines. The individual conductive lines 206 may be electrically coupled to respective common contact pads or electrodes on opposite ends of the plurality of conductive lines 206, for application of a current.

In various embodiments, the beam 204 may be displaced as a result of a force (e.g. Lorentz force) acting on the beam 204, where the force may be induced or generated as a result of the current flow through the plurality of conductive lines 206, and the interaction of the magnetic field with the beam 204. In various embodiments, the plurality of conductive lines 206 may collectively generate a net force (e.g. Lorentz force) in a sensitive direction of the sensor 200 under an externally applied magnetic field. The magnitude of the force may be proportional to the amplitude of the current and the length of the beam 204. Further, the magnitude of the force may be proportional to the number of the plurality of conductive lines 206. This may mean that the magnitude of the force, and hence the amount of displacement of the beam 204, may scale with the number of the plurality of conductive lines 206.

In various embodiments, the beam 204 may be displaced in a direction at least substantially perpendicular or orthogonal to the direction of the current flow and the direction of the magnetic field. Referring to FIG. 2A, as a non-limiting example, the current, I, may flow in the direction as represented by the arrow 210, while the magnetic field, B, may be in one of two directions represented by the double-headed arrow 212, at least substantially orthogonal to the direction of the current. A force, F, may be generated, which may be in one of two directions represented by the double-headed arrow 214, depending on the direction of the magnetic field, B. The direction of the force may be at least substantially orthogonal to the direction of the current and the direction of the magnetic field. In various embodiments, the direction of the magnetic field, B, may be at least substantially transverse to the longitudinal axis of the beam 204.

In various embodiments, the current, I, flowing through the plurality of conductive lines 206 may be an alternating current (AC). The current, I, may be a sinusoidal current.

In various embodiments, the current, I, flowing through the plurality of conductive lines 206 may have a frequency. The current, I, may have a frequency that is at least substantially equal to a resonant frequency of the beam 204 or the sensor 200. This may result in the frequency of the force generated on the beam 204 to be at least substantially equal to the resonant frequency of the beam 204 or the sensor 200. In this way, the sensitivity of the sensor 200 may be enhanced by its quality factor (Q). This may mean that the amount of the displacement of the beam 204 may scale with the quality factor (Q) of the sensor 200, and a larger displacement may therefore be achieved.

In the context of various embodiments, the property of the magnetic field may include at least one of a magnitude or amplitude of the magnetic field, or a direction of the magnetic field. As a non-limiting example, the magnitude of the magnetic field may be determined based on the amount of displacement of the beam 204. The amount or amplitude of the displacement of the beam 204 may be proportional to the magnitude of the magnetic field. As a further non-limiting example, the direction of the magnetic field may be determined based on the direction of the displacement of the beam 204.

In the context of various embodiments, the beam 204 may include or may be made of a non-conductive material. In this way, the plurality of conductive lines 206 arranged on the non-conductive beam may be electrically isolated from each other.

In the context of various embodiments, at least one of the substrate 202 or the beam 204 may include silicon (Si). In other words, the material of at least one of the substrate 202 or the beam 204 may include a Si-based material.

In various embodiments, a number or some of the conductive lines of the plurality of conductive lines 206 may be arranged to conduct or flow the current in the same direction, so as to generate a net force (eg. Lorentz force) in a particular direction, e.g. a sensitive direction of the sensor 200. For example, this may mean that some of the conductive lines may be arranged to conduct the current in one direction to generate a first force (e.g. Lorentz force) in a first sensitive direction, while the remaining conductive lines may be arranged to conduct the current in another direction (e.g. opposite direction) to generate a second force (e.g. Lorentz force) in a second sensitive direction, such that overall, a net or effective force may still be generated in either the first sensitive direction or the second sensitive direction, depending on the respective magnitudes and directions of the first force and the second force.

In various embodiments, the plurality of conductive lines 206 may be arranged to conduct or flow the current in the same direction. In other words, the current may flow through the plurality of conductive lines 206 unidirectionally. This may mean that the current flowing through all of the plurality of conductive lines 206 may flow in a single direction along the beam 204. In this way, the net force generated may be an additive sum of the respective forces due to each conductive line of the plurality of conductive lines 206 in the same direction, e.g. a sensitive direction of the sensor 200.

In various embodiments, the plurality of conductive lines 206 may be arranged to conduct the current in series. This may mean that the plurality of conductive lines 206 may be serially connected or electrically coupled in series to each other. Therefore, the plurality of conductive lines 206 may be connected to each other one after the other.

In various embodiments, such a series connection of the plurality of conductive lines 206 may enable a current reuse scheme to be employed in the sensor 200. This may enable the current to be used more than once. This may mean that the current flowing through the plurality of conductive lines 206 may pass through the beam 204 more than once.

In various embodiments, the plurality of conductive lines 206 may be arranged at least substantially parallel to each other on the beam 204. However, it should be appreciated that the plurality of conductive lines 206 may not be arranged parallel to each other on the beam 304, as long as a net force (e.g. Lorentz force) may be generated in the same direction or a particular direction, e.g. a sensitive direction of the sensor 200.

In various embodiments, the plurality of conductive lines 206 may form part of a single line arrangement. For example, the plurality of conductive lines 206 may be portions of a single conductive line. The plurality of conductive lines 206 may be arranged in series within the single line arrangement.

In various embodiments, the substrate 202 may include a first edge portion (e.g. Si portion) and a second edge portion (e.g. Si portion), wherein the first edge portion and the second edge portion may be arranged adjacent opposite sides of the beam 204, and wherein the plurality of conductive lines 206 may form part of a continuous line arrangement wound around the beam 204, the first edge portion and the second edge portion. Therefore, there may be windings of the continuous line arrangement on the sensor 200.

In various embodiments, the sensor 200 may further include an insulator material or a dielectric material between the plurality of conductive lines 206 and the beam 204. The insulator material may electrically isolate the plurality of conductive lines 206 from the beam 204. This may be helpful in embodiments where the beam 204 may be conductive. The insulator material may electrically isolate the plurality of conductive lines 206 from each other. In the context of various embodiments, the insulator material may include but not limited to silicon oxide ($SiO_x$) or silicon nitride ($Si_xN_y$).

In various embodiments, the sensor 200 may further include at least one sensing element configured to determine the displacement of the beam 204. There may be one, two, three, four, five or any higher number of sensing elements provided on the sensor 200. The at least one sensing element may be employed to determine at least one of a magnitude or a direction of the displacement of the beam 204.

In various embodiments, the at least one sensing element may include a piezoelectric material or a piezoresistive material.

In various embodiments, the at least one sensing element may include an optical sensing element. This may mean that the displacement of the beam 204 may be sensed using an optical sensing method.

In various embodiments where the at least one sensing element may include a piezoelectric material or a piezoresistive material or an optical sensing element, the beam 204 may be a non-conductive beam, meaning that the beam 204 may include or may be made of a non-conductive material.

In various embodiments, the at least one sensing element may be a capacitive sensing element, e.g. the at least one sensing element may be configured to change its capacitance corresponding to the displacement of the beam 204. In other words, a change in the capacitance of the at least one sensing element may provide a measure of the amount or amplitude of the displacement, which may be proportional to the magnitude of the magnetic field whose property is to be determined. In various embodiments where the at least one sensing element may include a capacitive sensing element, the beam 204 may be a conductive beam, meaning that the beam 204 may include or may be made of a conductive material.

In various embodiments, the at least one sensing element may be arranged at any position suitable for determining the displacement of the beam 204. In various embodiments, the at least one sensing element may be coupled to the beam 204.

In the context of various embodiments, the at least one sensing element may include a pair of electrodes movable relative to each other. Each electrode may be arranged at least substantially parallel to the beam 204 or the longitudinal axis of the beam 204. The pair of electrodes may define a capacitor. The pair of electrodes may be arranged at least substantially parallel to each other to define parallel plates.

In various embodiments, an electrode of the pair of electrodes of the at least one sensing element may be connected to the beam 204. The electrode connected to the beam 204 may be movable in consequence of the displacement of the beam 204. The other electrode may be fixed (stationary). This may mean that the at least one sensing element may be defined by a movable electrode and a fixed electrode. The movable electrode may move in sync with the displacement of the beam 204, relative to the fixed electrode. As the relative spacing between the movable electrode and the fixed electrode changes, the associated capacitance changes. The change in the capacitance may be used to determine the displacement of the beam 204, and consequently a property of the magnetic field. In embodiments where the amount of the displacement of the beam 204 may scale with the quality factor (Q) of the sensor, larger capacitance changes may be achieved.

In various embodiments, each electrode of the pair of electrodes may include a plurality of fingers. This may mean that each electrode may have a comb-shaped arrangement. The respective plurality of fingers of the pair of electrodes may be arranged at least substantially parallel to the beam 204 or the longitudinal axis of the beam 204. In various embodiments, the pair of electrodes may be arranged in an interdigitated pattern. This may mean that respective fingers of the pair of electrodes may be alternately arranged.

In various embodiments, the sensor 200 may include at least one first sensing element arranged on a first side of the beam 204, and at least one second sensing element arranged on a second side of the beam 204 opposite to the first side. In various embodiments, the at least one first sensing element and the at least one second sensing element may be arranged symmetrically about the beam 204. There may be one, two, three, four, five or any higher number of the first sensing elements provided on the sensor 200. There may be one, two, three, four, five or any higher number of the second sensing elements provided on the sensor 200. In various embodiments, there may be equal numbers of the first sensing element(s) and the second sensing element(s).

In various embodiments, for determining the displacement of the beam 204, each of the at least one first sensing element and the at least one second sensing element may change its respective associated property (e.g. capacitance). Each of the at least one first sensing element and the at least one second sensing element may change its respective associated property asymmetrically. As a non-limiting example, when the displacement of the beam 204 is in a particular direction (or in a reverse direction), the capacitance of the at least one first sensing element may increase (or decrease), while the capacitance of the at least one second sensing element may decrease (or increase).

The sensor 200 may further include at least one resilient element coupled to the beam 204 for suspending the beam 204 from the substrate 202. For example, a first resilient element may be coupled to a first end region of the beam 204 and a second resilient element may be coupled to a second end region of the beam 204. The first end region and the second end region of the beam 204 may be opposite end regions. In various embodiments, each resilient element may be a spring.

The sensor 200 may further include a processing circuit configured to determine the property of the magnetic field, based on the displacement of the beam 204. The processing circuit may be electrically coupled to the at least one sensing element for determining the property of the magnetic field based on the displacement of the beam 204 determined by the at least one sensing element. In various embodiments, the processing circuit may include demodulation readout electronics.

Each conductive line of the plurality of conductive lines 206 may include or may be made of any conductive material. In the context of various embodiments, each conductive line of the plurality of conductive lines 206 may include or may be made of a metal. For example, the plurality of conductive lines 206 may be metal lines. Each metal line may provide a low resistivity current path. In the context of various embodiments, the metal may include but not limited to aluminium (Al), gold (Au), copper (Cu), nickel (Ni), platinum (Pt), or titanium (Ti). Other process-able and good quality conductive metals may also be used.

In the context of various embodiments, each conductive line of the plurality of conductive lines 206 may include or may be made of a conductive poly-silicon, e.g. a highly doped poly-silicon material.

In the context of various embodiments, each conductive line may have a resistivity of between about $1.5 \times 10^{-8}$ $\Omega$m and about $2 \times 10^{-5}$ $\Omega$m, for example between about $1.5 \times 10^{-8}$ $\Omega$m and about $1 \times 10^{-5}$ $\Omega$m, between about $1.5 \times 10^{-8}$ $\Omega$m and about $1 \times 10^{-6}$ $\Omega$m, between about $1.5 \times 10^{-8}$ $\Omega$m and about $1 \times 10^{-7}$ $\Omega$m, between about $1 \times 10^{-7}$ $\Omega$m and about $1 \times 10^{-5}$ $\Omega$m, or between about $1 \times 10^{-8}$ $\Omega$m and about $1 \times 10^{-7}$ $\Omega$m. For example, each conductive line may have the following material with the associated resistivity value (in brackets): silicon ($1 \times 10^{-5}$ $\Omega$m-$2 \times 10^{-5}$ $\Omega$m), copper ($1.68 \times 10^{-8}$ $\Omega$m), aluminium ($2.82 \times 10^{-8}$ $\Omega$m), nickel ($6.99 \times 10^{-8}$ $\Omega$m), platinum ($1.06 \times 10^{-7}$ $\Omega$m) or titanium ($4.20 \times 10^{-7}$ $\Omega$m). However, it should be appreciated that other resistivity values may be possible depending on the material (e.g. metal) used, as resistivity is a material property which is fixed.

In the context of various embodiments, the plurality of conductive lines 206 may provide a total or overall resistance of about 100$\Omega$ to any high resistance value, depending on the number of the plurality of conductive lines (e.g. parallel metal lines) used and/or the material of each conductive line, which may be up to 50-100 k$\Omega$. As non-limiting examples, the overall resistance of the plurality of conductive lines 206 may be between about 100$\Omega$ and about 100 k$\Omega$, for example between about 100$\Omega$ and about 50 k$\Omega$, between about 100$\Omega$ and about 10 k$\Omega$, between about 100$\Omega$ and about 1 k$\Omega$, between about 1 k$\Omega$ and about 100 k$\Omega$, between about 1 k$\Omega$ and about 50 k$\Omega$, or between about 10 k$\Omega$ and about 100 k$\Omega$. In various embodiments, the overall resistance of the plurality of conductive lines 206 may be between about 700$\Omega$ and about 900 $\Omega$.

In the context of various embodiments, the number of conductive lines in the plurality of conductive lines 206 may be in a range of between 2 and 100, for example between 2 and 50, between 2 and 20, between 2 and 10, between 20 and 100, between 50 and 100, or between 20 and 50. However, it should be appreciated that any number of conductive lines, including more than 100 conductive lines, may be provided, for example there may be 1000 conductive lines. In various embodiments, the number of conductive lines may depend on sensor design and/or sensor requirement.

In the context of various embodiments, the sensor 200 may be a magnetometer, for example a vertical axis magnetometer sensor. The sensor 200 may operate based on the Lorentz force principle, which may mean that the sensor 200 may be a Lorentz force sensor (e.g. a Lorentz force magnetometer).

In various embodiments, by providing a plurality of conductive lines 206, multiple current paths may be provided on the beam 204, which as a result may enhance the sensitivity of the sensor 200, while reducing the noise level of the sensor 200.

Various embodiments of the sensor 200 may employ a current reuse architecture where the current may flow along the beam a plurality of times through the plurality of conductive lines 206. As a result, the sensitivity of the sensor 200 may be increased and the noise level of the sensor 200 may be decreased.

Figure 2B:
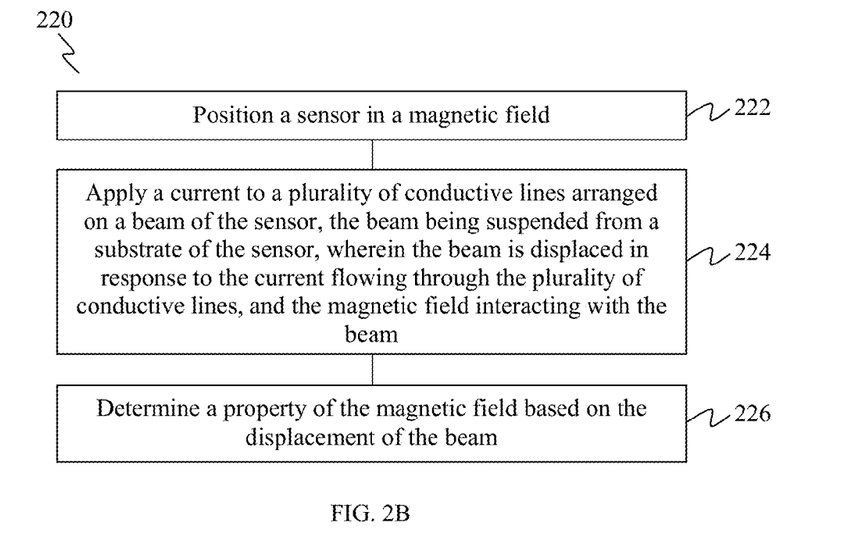
FIG. 2B shows a flow chart illustrating a method of controlling a sensor, according to various embodiments.

FIG. 2B shows a flow chart 220 illustrating a method of controlling a sensor, according to various embodiments.

At 222, a sensor is positioned in a magnetic field. The magnetic field may be an external magnetic field whose property is to be determined.

At 224, a current is applied to a plurality of conductive lines arranged on a beam of the sensor, the beam being suspended from a substrate of the sensor, wherein the beam is displaced in response to the current flowing through the plurality of conductive lines, and the magnetic field interacting with the beam.

At 226, a property of the magnetic field is determined based on the displacement of the beam.

In various embodiments, at 224, the current that is applied may have a frequency that is at least substantially equal to a resonant frequency of the beam.

In various embodiments, at 224, the current that is applied may flow through the plurality of conductive lines in the same direction.

Figure 3:
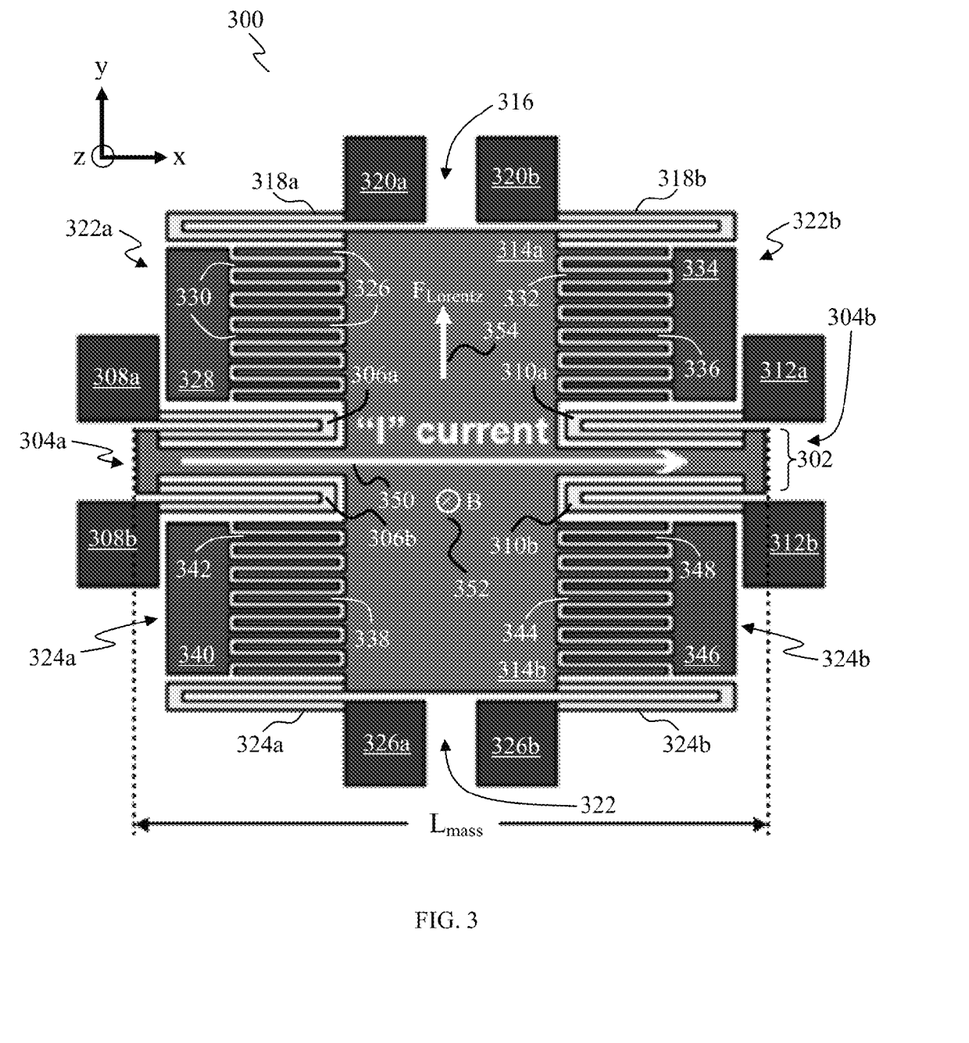
FIG. 3 shows a schematic top view of a magnetometer.

FIG. 3 shows a schematic top view of a magnetometer (or sensor) 300. The magnetometer 300 may be a vertical axis magnetometer. The magnetometer 300 may include a suspended beam 302, which may act as a current conducting path. An end region 304a of the beam 302 may be coupled via springs 306a, 306b on opposite sides of the beam 302 to respective contact pads 308a, 308b. An opposite end region 304b of the beam 302 may be coupled via springs 310a, 310b on opposite sides of the beam 302 to respective contact pads 312a, 312b. The springs 306a, 306b, 310a, 310b may facilitate movement or displacement of the beam 302. The contact pads 308a, 308b, 312a, 312b may be used for application of a current, I, to the beam 302.

The magnetometer 300 may include side portions 314a, 314b extending laterally on opposite sides of the beam 302. An end region 316 of the side portion 314a may be coupled via springs 318a, 318b on opposite sides of the side portion 314a to respective contact pads 320a, 320b. An end region 322 of the side portion 314b may be coupled via springs 324a, 324b on opposite sides of the side portion 314b to respective contact pads 326a, 326b. The springs 318a, 318b, 324a, 324b may facilitate movement or displacement of the side portions 314a, 314b, and therefore also the beam 302 connected to the side portions 314a, 314b.

The magnetometer 300 may include four capacitive sensing elements: two capacitive sensing elements 322a, 322b arranged on one side of the beam 302 and on opposite sides of the side portion 314a, and two capacitive sensing elements 324a, 324b arranged on the opposite side of the beam 302 and on opposite sides of the side portion 314b. Each capacitive sensing element 322a, 322b, 324a, 324b may include a pair of electrodes, where each electrode has a plurality of fingers. Each pair of electrodes may be arranged in an interdigitated pattern.

Using the capacitive sensing element 322a as a non-limiting example, a plurality of fingers, as represented by 326 for two fingers, as part of an electrode, may be coupled to the beam 302. The plurality of fingers 326 may be movable as a result of the displacement of the beam 302. Therefore, the plurality of fingers 326 may form part of a movable electrode. The capacitive sensing element 322a may include a second electrode 328 having a plurality of fingers, as represented by 330 for two fingers. The electrode 328 may be stationary and thus may form a fixed electrode. The plurality of fingers 326, 330 may be arranged at least substantially parallel to each other to define capacitors. The plurality of fingers 326, 330 may be interdigitated, meaning that the plurality of fingers 326, 330 may be arranged alternately. Similarly, the capacitive sensing element 322b may include a movable electrode having a plurality of fingers 332 and a fixed electrode 334 having a plurality of fingers 336, the capacitive sensing element 324a may include a movable electrode having a plurality of fingers 338 and a fixed electrode 340 having a plurality of fingers 342, while the capacitive sensing element 324b may include a movable electrode having a plurality of fingers 344 and a fixed electrode 346 having a plurality of fingers 348.

As shown in FIG. 3, a current, I, as represented by the arrow 350, may be applied to the beam 302 to flow through the beam 302 in the (+x)-direction, such that the current 350 may flow from the end region 304a of the beam 302 towards the opposite end region 304b. The current 350 may be applied via the contact pads 308a, 308b and the springs 306a, 306b. The current 350 may be an alternating current (e.g. a sinusoidal current) having a frequency that is at least substantially equal to the resonating frequency of the sensing mode (or sensitive mode) of the mechanical sensor or magnetometer 300, where the sensing mode may be, for example, the primary mode, the second mode, the third mode or any other higher mode. Therefore, the frequency of the current 350 may be precisely adjusted or controlled to at least substantially correspond to the resonant frequency of the sensing mode of the magnetometer 300 so that the mechanical sensitivity of the magnetometer 300 may be enhanced with its Quality factor (Q). This may mean that the sensitivity of the magnetometer 300 may be improved by a factor corresponding to Q.

When an external magnetic field, B, is applied to the sensor 300, in the vertical direction (along the z-direction), the beam 302 may start to oscillate along the y-direction at its resonance frequency. As a non-limiting example, the magnetic field, B, as represented by the circular symbol 352, may interact with the beam 302, where the magnetic field 352 may be in the (−z)-direction (i.e. pointing into the page). The current 350 and the magnetic field 352 may act to generate a force (e.g. a Lorentz force, $F_{Lorentz}$), as represented by the arrow 354, in the (+y)-direction, thereby causing the beam 302, as well as the side portions 314a, 314b, to displace or deflect in the (+y)-direction. The oscillation or displacement may be picked up by the parallel plate capacitances of at least one of the capacitive sensing elements 322a, 322b, 324a, 324b, and the magnetic field information may be extracted using demodulation readout electronics.

The Lorentz force, $F_{Lorentz}$, (e.g. 354) acting on the magnetometer 300 may be determined using Equation (1) below:

$$F_{Lorentz} = (B \times I) \cdot L \qquad \text{(Equation 1)},$$

where I is the current (e.g. 350) flowing on a conductive material (e.g. beam 302), B is the magnetic field (e.g. 352) acting on this conductive material, and L is the length of the conductor (e.g. beam 302) carrying this current. For the magnetometer 300, the length of the conductor or beam 302 carrying the current 350 is $L_{mass}$ as shown in FIG. 3.

Referring to FIG. 3, when the Lorentz force, $F_{Lorentz}$, 354 acts on the suspended mass or beam 302, the force, $F_{Lorentz}$, 354 causes the suspended mass 302 to deflect along the (+y)-direction, from its original or equilibrium position, and as a result, the capacitances corresponding to the respective capacitive sensing elements 322a, 322b, 324a, 324b may be changed. This is because the deflection may cause the positions of the movable electrode fingers 326, 332, 338, 344 relative to the corresponding stationary electrode fingers 330, 336, 342, 348 to be changed, causing the distance between adjacent electrode fingers (e.g. the spacing between a movable electrode finger and an adjacent stationary electrode finger) to change, thus varying the capacitance.

In order to increase or maximize the capacitance change, the frequency of the applied force, $F_{Lorentz}$, 354 may be matched to the natural resonating frequency, $f_{res}$, of the mechanical structure of the magnetometer 300. This may be achieved by matching the frequency of the current, I, 350 to the mechanical resonant frequency, $f_{res}$, of the magnetometer 300.

When a sinusoidal current, I, (e.g. 350) having a frequency that is at least substantially equal to the mechanical resonant frequency, $f_{res}$, of a magnetometer (e.g. 300) is applied, the deflection, x, of the suspended mass (e.g. 302) under a magnetic field, B, (e.g. 352) may be determined by:

$$x = \frac{F_{Lorentz}}{k}Q, \quad \text{(Equation 2)}$$

$$x = \frac{(B \times I) \cdot L}{k}Q, \quad \text{(Equation 3)}$$

where Q is the overall Quality factor of the mechanical sensor (i.e. magnetometer 300) and k is its spring constant.

Two other performance parameters for a magnetometer (e.g. 300) include the Brownian Noise, $N_{Brownian}$, and the bandwidth, BW, which may respectively be determined using Equations (4) and (5):

$$N_{Brownian} = \sqrt{4k_bT\frac{\sqrt{k \cdot m}}{Q}}\frac{1}{I \cdot L}, \quad \text{(Equation 4)}$$

$$BW = \frac{1}{2\pi}\sqrt{\frac{k}{m}}\frac{1}{Q}, \quad \text{(Equation 5)}$$

where $k_b$ is the Boltzmann's constant, T is the ambient temperature and m is the effective mass of the suspended beam (e.g. 302), and including the mass contribution from the associated springs (e.g. 306a, 306b, 310a, 310b, 318a, 318b, 324a, 324b) and the plurality of fingers (e.g. 326, 332, 338, 344) coupled to the suspended beam.

According to Equations (3) and (4), increasing the quality factor, Q, may increase the sensitivity of the magnetometer, and decrease the noise resolution of the magnetometer. However, an increased Q also decreases the bandwidth, BW, of the structure according to Equation (5). Therefore, there is a need for a method or approach to improve both the sensitivity and the Brownian Noise, and at the same time, not lose from the bandwidth.

Conventional vertical axis magnetometers use their silicon mass as the current carrying path to convert a magnetic field into a Lorentz force. Although this technique is successful, it has several drawbacks. The first drawback of this technique is the high resistivity of silicon. Due to this high resistivity, the voltage that is required to drive the current into the conventional magnetometers is also high, which usually draw a lot of power from the system. The second drawback is the inefficient use of this current.

Figures 4A, 4B:
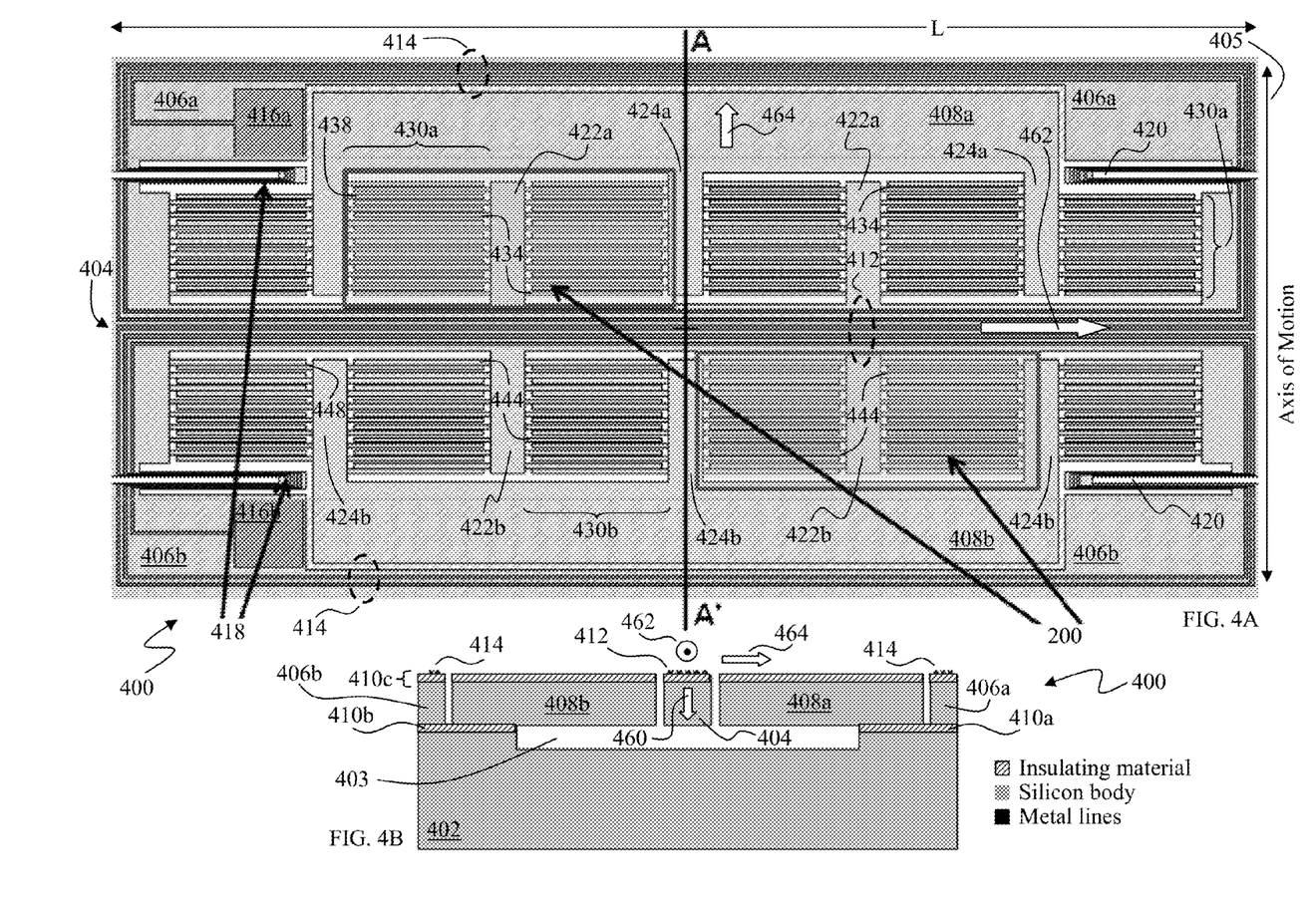
FIGS. 4A and 4B show a schematic top view and a schematic cross-sectional view, respectively, of a sensor, according to various embodiments.

In contrast, various embodiments employ a current reuse method to increase the sensitivity and decrease the Brownian noise level for vertical axis magnetometers. FIG. 4A shows a schematic top view of a sensor 400, according to various embodiments, illustrating a vertical axis current reuse magnetometer structure. FIG. 4B show a schematic cross-sectional view of the sensor 400, taken along the line A-A' indicated in FIG. 4A. The sensor 400 may be used for determining a property of a magnetic field.

The sensor or vertical axis magnetometer 400 includes a silicon (Si) substrate 402 or a base portion 402 of a Si substrate, and a beam 404 suspended from the substrate 402. Therefore, the beam 404 may form a suspended mass over the substrate 402. The beam 404 may be spaced apart from the substrate 402 by a gap (e.g. an air gap) represented as 403. The beam 404 may be an elongate structure extending along the length of the sensor 400. The beam 404 may be movable, for example the beam 404 may be displaced in a direction along an axis of motion as represented by the double-headed arrow 405. In various embodiments, the beam 404 may be conductive.

The sensor 400 may include a first Si edge portion 406a on one side of the beam 404 and a second Si edge portion 406b on an opposite side of the beam 404. The sensor 400 may further include a first Si intermediate portion 408a in between the beam 404 and the first Si edge portion 406a, and a second Si intermediate portion 408b in between the beam 404 and the second Si edge portion 406b. The first Si edge portion 406a and the first Si intermediate portion 408a may be connected or fixed to a first portion of the substrate 402, while the second Si edge portion 406b and the second Si intermediate portion 408b may be connected or fixed to a second portion of the substrate 402, as illustrated in FIG. 4B. Each of the first Si intermediate portion 408a and the second Si intermediate portion 408b may be spaced apart from the beam 404. The first Si edge portion 406a may be spaced apart from the first Si intermediate portion 408a, while the second Si edge portion 406b may be spaced apart from the second Si intermediate portion 408b. The first Si edge portion 406a, the first Si intermediate portion 408a, the beam 404, the second Si intermediate portion 408b and the second Si edge portion 406b may be at least substantially coplanar relative to each other.

The sensor 400 may include a layer 410a of insulating material between the first portion of the substrate 402 overlapping with the first Si edge portion 406a and a portion of the first Si intermediate portion 408a, and a layer 410b of insulating material between the second portion of the substrate 402 overlapping with the second Si edge portion 406b and a portion of the second Si intermediate portion 408b. The sensor 400 may further include a layer 410c of insulating material on top of each of the first Si edge portion 406a, the first Si intermediate portion 408a, the beam 404, the second Si intermediate portion 408b and the second Si edge portion 406b. The insulating material of each of the layers 410a, 410b, 410c may be silicon oxide ($SiO_x$) or silicon nitride ($Si_xN_y$).

A plurality of conductive lines (e.g. metal lines) 412 may be formed on the beam 404, over the insulating layer 410c. The insulating layer 410c deposited on the beam 404, which may be conductive, may isolate, including electrically isolate, the plurality of conductive lines 412 from each other. The plurality of conductive lines 412 may be arranged at least substantially parallel to each other. The plurality of conductive lines 412 may be part of a continuous line arrangement (e.g. a single conductive line arrangement), represented as 414, wound around the structure of the sensor 400. As a non-limiting example, the continuous line arrangement 414 may be wound around the beam 404, the first Si edge portion 406a and the second Si edge portion 406b, thereby forming a plurality of conductive windings on the sensor 400. Therefore, the plurality of conductive lines 412 may be connected in series, thereby allowing a current to flow through the plurality of conductive lines 412 in series. The plurality of conductive lines 412 may be arranged to conduct the current in the same direction. Respective ends of the continuous line arrangement 414 may be electrically coupled to respective contact pads 416a, 416b, for application of a current. The contact pads 416a, 416b may be provided on the first Si edge portion 406a and the second Si edge portion 406b respectively.

The sensor 400 may include two first resilient elements (e.g. springs) 418 coupled to an end region of the beam 404, on opposite sides of the beam 404. The sensor 400 may further include two second resilient elements (e.g. springs) 420 coupled to an opposite end region of the beam 404, on opposite sides of the beam 404. The two first resilient elements 418 and the two second resilient elements 420 may enable the beam 404 to be suspended from the substrate 402. The two first resilient elements 418 and the two second resilient elements 420 may facilitate movement or displacement of the beam 404. The continuous line arrangement 414 may be arranged around the two first resilient elements 418 and the two second resilient elements 420.

The beam 404 may include first side portions 422a and second side portions 422b extending laterally on opposite sides. The first Si intermediate portion 408a may include protrusions 424a that may be arranged alternately with the first side portions 422a of the beam 404. The second Si intermediate portion 408b may include protrusions 424b that may be arranged alternately with the second side portions 422b of the beam 404.

The sensor 400 may further include a plurality of sensing elements (e.g. capacitive elements). As a non-limiting example, six first sensing elements, as represented by 430a for two first sensing elements, may be disposed on one side of the beam 404, and six second sensing elements, as represented by 430b for one second sensing element, may be disposed on the opposite side of the beam 404. The first sensing elements 430a and the second sensing elements 430b may be arranged symmetrically about the beam 404.

Each of the first sensing elements 430a and the second sensing elements 430b may include a set of two electrodes (a pair of electrodes), where each electrode may have a plurality of fingers (e.g. capacitive sensing fingers). The pair of electrodes of each first sensing element 430a and each second sensing element 430b may be arranged in an interdigitated configuration.

Each first sensing element 430a may have a plurality of first fingers, as represented by 434 for three first fingers, that are coupled or connected to the beam 404, via the first side portions 422a. As the beam 404 is displaced, the plurality of first fingers 434 may also be displaced. This means that the plurality of first fingers 434 may be movable, and therefore define a movable electrode. Each first sensing element 430a may have a plurality of second fingers, as represented by 438 for one second finger, that are coupled or connected to the first Si intermediate portion 408a, via the protrusions 424a. As the first Si intermediate portion 408a is stationary, the plurality of second fingers 438 may be fixed, and therefore define a fixed electrode.

The plurality of first fingers 434 and the plurality of second fingers 438 may be spaced apart from each other and arranged at least substantially parallel to each other to define parallel plates. The plurality of first fingers 434 and the plurality of second fingers 438 may be arranged at least substantially parallel to the beam 404. The plurality of first fingers 434 and the plurality of second fingers 438 may be arranged alternately in an interdigitated pattern. As the beam 404 is displaced, the plurality of first fingers 434 may be displaced relative to the plurality of second fingers 438, thereby changing the associated capacitances.

Each second sensing element 430b may have a plurality of first fingers, as represented by 444 for four first fingers, that are coupled or connected to the beam 404, via the second side portions 422b. As the beam 404 is displaced, the plurality of first fingers 444 may also be displaced. This means that the plurality of first fingers 444 may be movable, and therefore define a movable electrode. Each second sensing element 430b may have a plurality of second fingers, as represented by 448 for one second finger, that are coupled or connected to the second Si intermediate portion 408b, via the protrusions 424b. As the second Si intermediate portion 408b is stationary, the plurality of second fingers 448 may be fixed, and therefore define a fixed electrode.

The plurality of first fingers 444 and the plurality of second fingers 448 may be spaced apart from each other and arranged at least substantially parallel to each other to define parallel plates. The plurality of first fingers 444 and the plurality of second fingers 448 may be arranged at least substantially parallel to the beam 404. The plurality of first fingers 444 and the plurality of second fingers 448 may be arranged alternately in an interdigitated pattern. As the beam 404 is displaced, the plurality of first fingers 444 may be displaced relative to the plurality of second fingers 448, thereby changing the associated capacitances.

In various embodiments as described above, having a beam 404 that may be conductive may be helpful for the sensor 400 employing capacitive sensing by means of the first sensing elements 430a and the second sensing elements 430b, for measuring the respective capacitances between the beam 404 and the first Si intermediate portion 408a and between the beam 404 and the second Si intermediate portion 408b. The insulating layer 410c may enable the plurality of conductive lines 412 to be electrically isolated from each other, while being arranged on the beam 404.

In operation, the sensor 400 may be positioned in a vicinity of an external magnetic field, B, whose associated property is to be determined. The magnetic field may interact with the beam 404. As a non-limiting example, the magnetic field may be in a direction pointing downwardly, towards the substrate 402, as represented by the arrow 460 in FIG. 4B. A current, I, as represented by the arrow 462, may be applied to the plurality of conductive lines 412, by means of the contact pads 416a, 416b, to flow through the plurality of conductive lines 412. Therefore, instead of applying a current to the mass of the magnetometer as employed in conventional magnetometers, the current 462 is applied to the plurality of conductive lines 412 which are fabricated on top of the mass or beam 404 of the sensor 400.

In various embodiments, the current 462 may flow through the plurality of conductive lines 412 in series, via windings formed in the continuous line arrangement 414, so that the current 462 may flow along the beam a plurality of times. Power may be saved by using the current multiple times, instead of increasing the amount of power to achieve the same amount of sensitivity.

The current 462 may flow through the plurality of conductive lines 412 in the same current flow direction, from one end region of the beam 404 towards an opposite end region of the beam 404. The current 462 may be an alternating current (e.g. a sinusoidal current). The magnetic field 460 and the current 462 may cause a Lorentz force, $F_{Lorentz}$, as represented by the arrow 464, to be generated, in accordance with Equation 1. The direction of $F_{Lorentz}$ 464 may be towards the first Si intermediate portion 408a, thereby causing the beam 404 to be displaced towards the first Si intermediate portion 408a. The direction of $F_{Lorentz}$ 464 may be in the sensitive direction of the sensor 400. Similarly, the first side portions 422a and the second side portions 422b may be displaced towards the first Si intermediate portion 408a. Consequently, the plurality of first fingers 434 of the first sensing elements 430a and the plurality of first fingers 444 of the second sensing elements 430b may also be displaced towards the first Si intermediate portion 408a. For the first sensing elements 430a, as each first finger 434 is displaced towards a corresponding second finger 438, the separation therebetween is decreased, causing an increase in capacitance. For the second sensing elements 430b, as each first finger 444 is displaced away from a corresponding second finger 448, the separation therebetween is increased, causing a decrease in capacitance. This may mean that the first sensing elements 430a and the second sensing elements 430b may change its respective associated capacitances asymmetrically. In order to achieve larger capacitance changes, the frequency of the current 462 may be at least substantially matched to the resonant frequency of the beam 404, so as to enhance the displacement of the beam 404.

While not shown, the sensor 400 may include circuitry or electronic components, for example a processing circuit that may be employed to quantify the changes in capacitances of at least one first sensing element 430a and/or at least one second sensing element 430b, so as to quantify the displacement of the beam 404, in terms of magnitude and/or direction of the displacement, for determining a property of the magnetic field 460 acting on the beam 404.

As described above, instead of using the whole silicon body as the conducting medium as in conventional sensors, conductive lines or metal lines 412 deposited on top of the suspended mass or beam 404 of the sensor 400 may be used for conducting the current 462. As a non-limiting example for fabricating the sensor 400, an insulator may first be deposited on top of the whole structure, e.g. to form the layer 410c of insulating material, and metal lines may then be deposited on this insulating layer 410c to form the plurality of conductive lines 412. This may enable the fabrication of multiple parallel metal lines 412 which may conduct the current 462 in the same direction. These multiple metal lines 412 may be serially connected to each other by carrying the current 462 over the springs 418, 420 and the first Si edge portion 406a and the second Si edge portion 406b.

Referring to FIGS. 4A and 4B, there may be five parallel conductive lines 412 which may be connected to each other serially by winding them around the structure and all five conductive lines 412 may conduct the current 462 in the same direction. It should be appreciated that any number of the plurality of conductive lines 412 may be connected in series so that the applied current 462 may be used several times and the resulting Lorentz force may be multiplied by the number of the serially connected conductive lines 412. Therefore, the resulting force on the sensor mass or beam 404 may be N times larger where N is the number of the current conducting metal lines 412 on the suspended mass 404. This may mean that the sensitivity of the sensor or magnetometer 400 may be proportionally increased with the number of the conductive lines 412.

In addition to enhancing the sensitivity of the system, as the metal lines 412 are used instead of the bulk silicon body as the current conducting media, the resistivity of the current path may further be reduced. Assuming that the system is limited with a certain power budget, this decrease in resistance may allow applications of more current to the magnetometer or sensor 400 which may further increase the sensitivity of the sensor 400.

Simulation results for the sensor or magnetometer of various embodiments will now be described by way of the following non-limiting examples for illustrating the improvement in the sensitivity and thermal noise.

Figure 5:
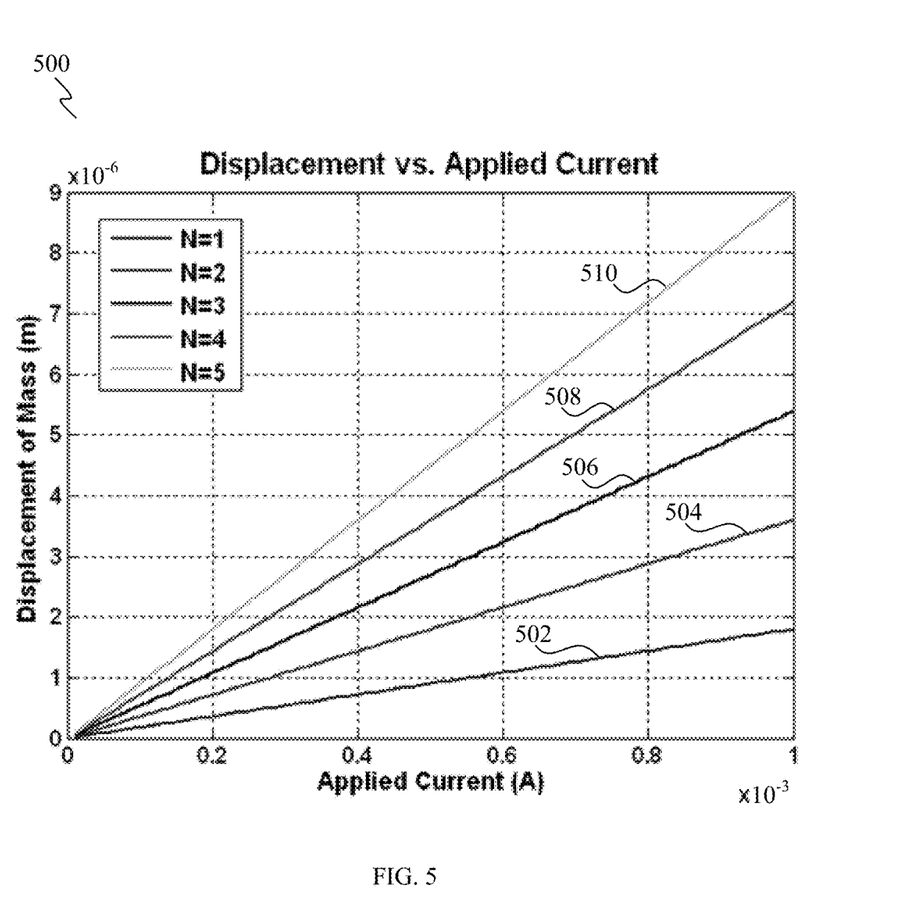
FIG. 5 shows a plot of the displacement of the sensor beam as a function of the applied current for different numbers of conductive lines, according to various embodiments.

FIG. 5 shows a plot 500 of the displacement of the sensor beam as a function of the applied current for different numbers, N, of conductive lines on the suspended beam, according to various embodiments, illustrating the displacement of the suspended magnetometer mass with respect to the current applied to the plurality of current lines.

Plot 500 shows result 502 for a single conductive line, result 504 for two conductive lines, result 506 for three conductive lines, result 508 for four conductive lines and result 510 for five conductive lines. As may be observed in FIG. 5, when the applied current is increased, the displacement of the beam of the magnetometer is also increased, in accordance with Equation 3. Plot 500 also shows that the slope of the displacement curves 502, 504, 506, 508, 510 increases with increasing number of the current carrying metal lines.

Figure 6:
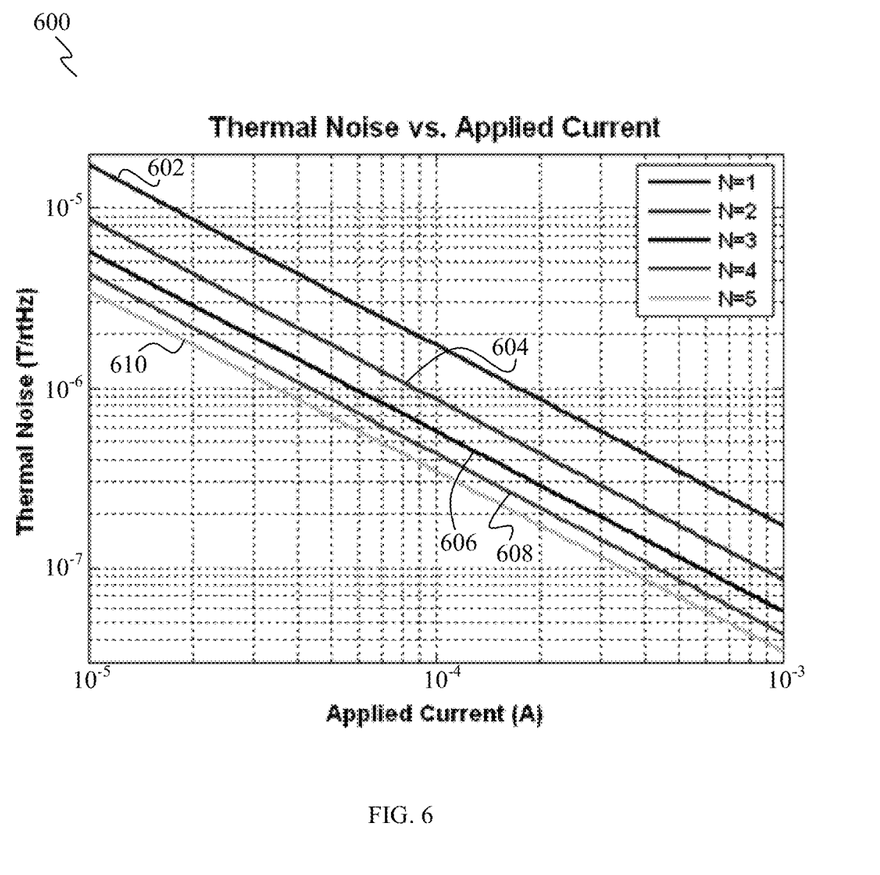
FIG. 6 shows a plot of the thermal noise of the sensor as a function of the applied current for different numbers of conductive lines, according to various embodiments.

FIG. 6 shows a plot 600 of the thermal noise of the sensor as a function of the applied current for different numbers, N, of conductive lines on the suspended beam of the sensor, according to various embodiments, illustrating the thermal noise of the magnetometer with respect to the current applied to the plurality of current lines.

Plot 600 shows result 602 for a single conductive line, result 604 for two conductive lines, result 606 for three conductive lines, result 608 for four conductive lines and result 610 for five conductive lines, illustrating changes in the thermal noise. As may be observed in FIG. 6, the thermal noise is decreased with increasing current, in accordance with Equation 4. Similar to the results shown in FIG. 5, increasing the number of the current carrying metal lines improves the thermal noise performance of the magnetometer.

Figure 7:
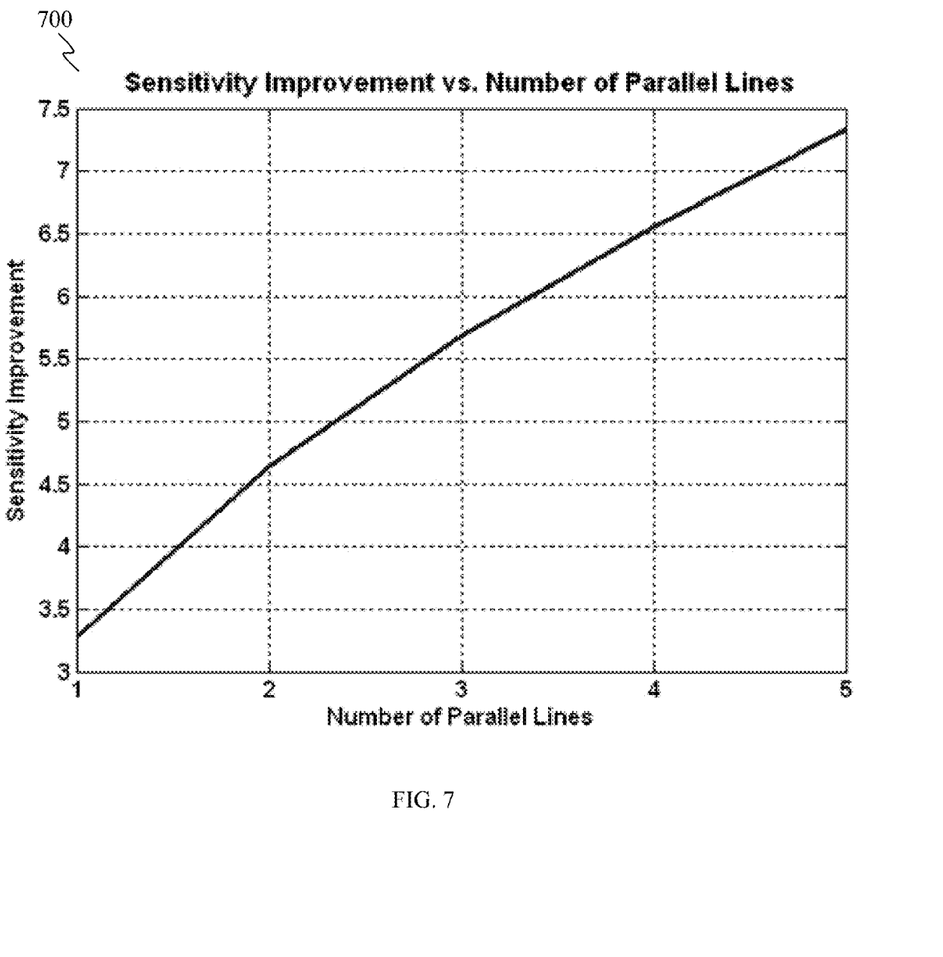
FIG. 7 shows a plot of the sensitivity improvement of the sensor of various embodiments as a function of the number of parallel conductive lines as compared to a conventional sensor with the current flowing through the bulk silicon, under the same power consumption criteria.

As the total resistance of the current carrying path is decreased in the sensor of various embodiments, the amount of power required to drive the magnetometer may decrease. FIG. 7 shows a plot 700 of the sensitivity improvement of the sensor of various embodiments as a function of the number of parallel conductive lines as compared to a conventional sensor with the current flowing through the bulk silicon, under the same power consumption criteria. In other words, plot 700 illustrates the comparison of the sensitivity values between the sensor of various embodiments and the conventional sensor, assuming that the amount of power used to drive the respective circuits or sensors is at least substantially constant.

As may be observed from plot 700, with the same amount of power that is used to drive the conventional magnetometer from its bulk silicon, the performance of the magnetometer of various embodiments may be improved approximately 7 times for embodiments employing 5 parallel current carrying lines. This shows that a lot of power may also be saved using the sensor of various embodiments employing the current reuse method.

As described above, various embodiments may provide a method for improving the sensitivity and noise resolution of the magnetometer or sensor. Conventional magnetometers use the body of the magnetometer as their current carrying medium to generate the Lorentz Force, which is a very inefficient technique. In contrast, in the sensor of various embodiments, parallel metal lines may be placed on the mass or beam of the magnetometer with an insulating layer in between, where the parallel metal lines may be serially connected together. The applied current may travel through these serially connected metal lines, which, as a result, may improve the sensitivity and thermal noise of the magnetic field measuring sensor by the number of the serially connected windings on the sensor. Further, instead of using the highly resistive silicon body, the deposited metal lines may provide a very low resistive path which may save a lot of power during the operation of the sensor of various embodiments. These improvements in the magnetometer performance are illustrated in the simulation results as described above.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A sensor for determining a property of a magnetic field, the sensor comprising:
 a substrate;
 a beam suspended from the substrate; and
 a plurality of conductive lines arranged on the beam, wherein the plurality of conductive lines are arranged at least substantially parallel to a longitudinal axis of the beam,
 wherein the substrate comprises a first edge portion and a second edge portion, the first edge portion and the second edge portion arranged adjacent opposite sides of the beam,
 wherein the plurality of conductive lines form part of a continuous line arrangement, the continuous line arrangement being wound around the beam, the first edge portion and the second edge portion such that the plurality of conductive lines are connected to each other in series to conduct a same current in series through the plurality of conductive lines,
 wherein the beam is adapted to be displaced in response to the same current flowing through the plurality of conductive lines, and a magnetic field interacting with the beam, and
 wherein the sensor is configured to determine the property of the magnetic field based on the displacement of the beam.

2. The sensor as claimed in claim 1, wherein the plurality of conductive lines are arranged to conduct the current in the same direction.

3. The sensor as claimed in claim 1, wherein the plurality of conductive lines are arranged at least substantially parallel to each other on the beam.

4. The sensor as claimed in claim 1, wherein the plurality of conductive lines forms part of a single line arrangement.

5. The sensor as claimed in claim 1, further comprising an insulator material between the plurality of conductive lines and the beam.

6. The sensor as claimed in claim 1, further comprising at least one sensing element configured to determine the displacement of the beam.

7. The sensor as claimed in claim 6, wherein the at least one sensing element comprises a pair of electrodes movable relative to each other.

8. The sensor as claimed in claim 7, wherein an electrode of the pair of electrodes is connected to the beam.

9. The sensor as claimed in claim 7, wherein each electrode of the pair of electrodes comprises a plurality of fingers.

10. The sensor as claimed in claim 9, wherein the pair of electrodes is arranged in an interdigitated pattern.

11. The sensor as claimed in claim 6, comprising:
 at least one first sensing element arranged on a first side of the beam; and
 at least one second sensing element arranged on a second side of the beam opposite to the first side.

12. The sensor as claimed in claim 1, further comprising at least one resilient element coupled to the beam for suspending the beam from the substrate.

13. The sensor as claimed in claim 1, further comprising a processing circuit configured to determine the property of the magnetic field.

14. The sensor as claimed in claim 1, wherein each conductive line of the plurality of conductive lines comprises a metal or a conductive poly-silicon.

15. The sensor as claimed in claim 14, wherein the metal is selected from the group consisting of aluminium, gold, copper, nickel, platinum, and titanium.

16. A method of controlling a sensor, the method comprising:
 positioning a sensor in a magnetic field;
 applying a current to a plurality of conductive lines arranged on a beam of the sensor, wherein the plurality of conductive lines are arranged at least substantially parallel to a longitudinal axis of the beam, wherein the beam is suspended from a substrate of the sensor, wherein the substrate comprises a first edge portion and a second edge portion, the first edge portion and the second edge portion arranged adjacent opposite sides of the beam, wherein the plurality of conductive lines form part of a continuous line arrangement, the continuous line arrangement being wound around the beam, the first edge portion and the second edge portion such that the plurality of conductive lines are connected to each other in series, wherein the current applied to the plurality of conductive lines is conducted in series as a same current through the plurality of conductive lines, and wherein the beam is displaced in response to the same current flowing through the plurality of conductive lines, and the magnetic field interacting with the beam; and
 determining a property of the magnetic field based on the displacement of the beam.

17. The method as claimed in claim 16, wherein applying a current to a plurality of conductive lines comprises applying a current having a frequency that is at least substantially equal to a resonant frequency of the beam.

18. The method as claimed in claim 16, wherein applying a current to a plurality of conductive lines comprises applying a current to flow through the plurality of conductive lines in the same direction.

* * * * *